(12) United States Patent
Zhang et al.

(10) Patent No.: US 11,664,256 B2
(45) Date of Patent: May 30, 2023

(54) PLACEMENT SYSTEM FOR DOOR OF WAFER POD

(71) Applicant: Shanghai GoNa Semiconductor Technology Co., Ltd., Shanghai (CN)

(72) Inventors: Dongfeng Zhang, Shanghai (CN); Weicheng Bao, Shanghai (CN); Wenguang Wang, Shanghai (CN); Xuchen Wang, Shanghai (CN); Ying Ye, Shanghai (CN)

(*) Notice: Subject to any disclaimer, the term of this patent is extended or adjusted under 35 U.S.C. 154(b) by 0 days.

(21) Appl. No.: 17/964,057

(22) Filed: Oct. 12, 2022

(65) Prior Publication Data
US 2023/0029491 A1 Feb. 2, 2023

Related U.S. Application Data

(63) Continuation-in-part of application No. PCT/CN2021/135593, filed on Dec. 6, 2021.

(51) Int. Cl.
*H01L 21/677* (2006.01)
(52) U.S. Cl.
CPC .. *H01L 21/67772* (2013.01); *H01L 21/67775* (2013.01)
(58) Field of Classification Search
CPC ......... H01L 21/67772; H01L 21/67775; E05D 15/04

USPC ........................................ 49/199, 204, 205
See application file for complete search history.

(56) References Cited

U.S. PATENT DOCUMENTS

| | | | |
|---|---|---|---|
| 2009/0082622 A1 | 3/2009 | Takekoshi et al. | |
| 2011/0005868 A1* | 1/2011 | Suzuki ............. | H01L 21/67772 187/391 |
| 2012/0137336 A1 | 5/2012 | Applegate et al. | |
| 2013/0042945 A1* | 2/2013 | Emoto ............. | H01L 21/67772 141/98 |
| 2019/0175423 A1 | 6/2019 | Inoue | |
| 2021/0351052 A1* | 11/2021 | Chu ......................... | G01L 5/00 |

* cited by examiner

*Primary Examiner* — Glenn F Myers
(74) *Attorney, Agent, or Firm* — Rumit Ranjit Kanakia

(57) ABSTRACT

The application discloses a placement system for a door of a wafer pod, including a loadport. A docking interface is formed in the loadport, a placement mechanism is arranged on one side surface of the loadport, and includes a swing component, a follower component, and a docking plate. The swing component and the follower component are respectively connected to the docking plate, and the swing component can drive the docking plate to place the docking plate obliquely above the docking interface. By utilizing the space at the top of the loadport, the structural layout of the loadport is more reasonable; and the docking plate is placed nearly horizontally after the door is placed at a designated position, and provides a supporting force to the door, so that dependence on the vacuum suction is decreased, thereby avoiding the influences due to fluctuations of air pressure.

7 Claims, 11 Drawing Sheets

PLACEMENT SYSTEM FOR DOOR OF WAFER POD

FIELD

The present application relates to the field of semiconductor processing, in particular to a placement system for a door of a wafer pod.

BACKGROUND

In the semiconductor processing process, wafers need to be transported and transferred at different positions of a production line, and the wafers are loaded generally using a loadport. The basic working principle is that the loadport performs operation on a wafer pod, after the wafer pod reaches a designated position, a door of the wafer pod is opened and the wafers are taken out by a manipulator or other equipment, thereby loading the wafers.

In the semiconductor processing process, the wafers need to be transported and transferred between different processing stations or need to be re-sorted. The above functions are achieved by using an equipment front end module (EFEM) and a sorter generally. The loadport is generally installed in the above equipment, and has the main functions of first sending the wafer pod to a docking interface, then opening and placing the door of the wafer pod to the designated position, and subsequently detecting the poses of the wafers by a wafer sensor. After the loadport completes the above functions, a manipulator or other equipment in the EFEM and sorter takes the wafers out from the wafer pod, and the wafers are further transported to the processing stations to load the wafers.

However, the docking plate and the wafer sensor in the current loadport move vertically downward together, resulting in an excessively compact structure of the loadport to be adverse to the assembling, debugging, and maintaining of the loadport, and meanwhile, resulting in that the door of the wafer pod is always in a vertical placement state in the whole process, and the stability of the door is maintained by the vacuum suction force of a suction cup on a front side of the docking plate of the loadport, which tends to be affected by fluctuations of air pressure. In addition, in the EFEM and the sorter, after being opened by the loadport, the door of the wafer pod is placed at the bottoms of the EFEM and the sorter; in order to keep away from the manipulator mounted on the bottoms of the EFEM and the sorter, there is a need to increase the volumes of the EFEM and the sorter, while in fact, there is a large empty space on tops of the EFEM and the sorter, which is not fully combined, exploited and used by the loadport, resulting in waste and high cost for maintaining the clean environment required for semiconductor processing. Therefore, the design volume of the equipment should not have redundancy.

The present application provides a placement system for a door of a wafer pod, which aims at reducing equipment volume and lowering production costs.

SUMMARY

In order to overcome the above drawbacks, an objective of the present application is to provide a placement system for a door of a wafer pod.

To achieve the above objective, the technical solutions employed by the present application are as follows: a placement system for a door of a wafer pod includes a loadport; wherein the loadport includes a base plate, a tank, and a loading table; a docking interface is formed in the base plate, and is matched with the door of the wafer pod in size; a placement mechanism is arranged on one side surface, facing away from the loading table, of the base plate, and includes a swing component, a follower component, and a docking plate; the swing component is arranged above the docking interface, and the follower component is arranged below the docking interface, the swing component and the follower component are respectively connected to the docking plate, and the swing component can drive the docking plate to place the docking plate obliquely above the docking interface; and the follower component can constrain a rotational freedom of the docking plate and enables a front side surface of the docking plate placed in place to face upwards.

Preferably, the swing component includes swing rods, a cross rod and an actuator. There are two swing rods which are symmetrically arranged on left and right sides of the docking plate. One end of each of the two swing rods is hinged to each of two first fixing seats fixed on the docking plate respectively, and the other end of each of the two swing rods is hinged to each of two second fixing seats fixed on the base plate respectively. Bosses are arranged on the swing rods. Two ends of the cross rod are fixedly connected to the bosses of the two swing rods respectively. The actuator is hinged between the cross rod and the base plate. The purpose is that the docking plate is located above the docking interface after being opened, and upon actuation by the actuator, the swing rods swing about a hinge point at the upper end and the docking plate is driven to be located obliquely above the docking interface.

Preferably, the actuator is a linear motion cylinder. A tail end of a cylinder body of the linear motion cylinder is fixedly connected to a cylinder tail connecting plate fixed on the base plate. The cylinder tail connecting plate is hinged to a support fixed on the base plate. A piston rod of the linear motion cylinder is fixedly connected to a double-knuckle joint. A boss is arranged in the middle of the cross rod, and the double-knuckle joint is hinged to the boss of the cross rod.

Preferably, the follower component includes connecting rods, a movable rod, a slider and a slide rail. There are two connecting rods which are arranged in parallel, and are symmetrically arranged on the left and right sides of the docking plate. One end of each of the two connecting rods is fixed on a back side surface of the docking plate, and the other end of each of the two connecting rods is hinged to the movable rod. Meanwhile, the movable rod is fixedly connected to the slider by the connecting plates, and the slide rail is sleeved with the slider. The slide rail is vertically fixed on the base plate. That is, the follower component achieves the restriction on the rotational freedom of the docking plate.

Preferably, the movable rod is in a "U" shape; the movable rod is matched with the docking interface in shape and size; and the movable rod and the slider synchronously perform linear translational movement in a plane parallel to the base plate along a direction of the slider. Such an arrangement allows, on the one hand, control on the movement path of the docking plate to enable the docking plate to be placed obliquely above the docking interface, and, on the other hand, does not interfere with an operation that a manipulator in an EFEM or a sorter takes wafers from and places wafers in the wafer pod by the docking interface.

Preferably, the swing rods of the swing component are hinged to the first fixing seats by a first rotating shaft; the first fixing seats are arranged on the back side surface of the docking plate; the swing rods of the swing component are hinged to the second fixing seats by a third rotating shaft;

and the connecting rods of the follower component are hinged to the movable rod by a second rotating shaft. In a state where the door of the wafer pod is closed, the docking plate is vertically arranged, and is parallel to the base plate. An axis of the third rotating shaft and an axis of the second rotating shaft form a vertical plane parallel to the base plate.

In the state where the door of the wafer pod is closed, the docking plate is vertically arranged and is parallel to the base plate, and meanwhile, the axis of the third rotating shaft and the axis of the second rotating shaft form the vertical plane that is parallel to the base plate.

Preferably, a distance from the axis of the first rotating shaft to the back side surface of the docking plate is less than a distance from the axis of the second rotating shaft to the back side surface of the docking plate. Since the door of the wafer pod is embedded in the wafer pod, upper, lower, left and right side surfaces of the door maintain a certain distance from the wafer pod, thereby avoiding that the door contacts or rubs against upper, lower, left and right inner walls of the wafer pod. However, during the process that the docking plate takes the door out from the wafer pod, the door is taken out from the wafer pod in a manner of swinging in a certain angle, rather than parallel movement; and during the swinging process, as the inclination of the door relative to wafer pod is greater, it is easier for the door to rub against the inner walls of the wafer pod and even produce a stress effect, so that not only is the abrasion of the inner walls of the wafer pod caused to affect the sealing effect, and meanwhile, dust particles produced in the abrasion process may affect the cleanness inside the wafer pod and even the EFEM and the sorter, and may also affect the stability of the fixation of the wafer pod on the loadport. Therefore, the production of the above hidden dangers can be avoided by decreasing the relative inclination of the door in the process of taking the door out from the wafer pod. To this end, the distance from the first rotating shaft to the back side surface of the docking plate is designed to be less than the distance from the second rotating shaft to the back side surface of the docking plate, which can make the swing rods present a certain degree of reverse inclination with respect to the docking plate at an initial position. This initial reverse inclination reduces the degree of relative inclination of the docking plate in the process that the door is taken out from the wafer pod, thereby avoiding friction or thrust between the door and the inner walls of the wafer pod when the door is taken out from the wafer pod.

Due to actuation by the placement system, the docking plate can close or open the docking interface; during closing, the door on the other side of the docking interface is adsorbed by a suction cup on the front side surface of the docking plate, and the door is placed at a designated position by actuation of the placement system. A back cover is further arranged on the back side surface of the docking plate, which seals vacuum lines in order to avoid interference with the lines during movement and to keep the surroundings of the lines clean, since the suction cup for adsorbing the door is arranged on the front side surface of the docking plate, and the vacuum lines providing suction for the suction cup are arranged on the back side surface of the docking plate.

The placement system for the door of the wafer pod makes full use of the space at the top of the loadport, making the structural layout of the loadport more reasonable. For a conventional loadport, when the door of the wafer pod is taken and placed, the door is always placed vertically, and the door is attached to the docking plate by vacuum suction completely; however, vacuum adsorption does not have the air-off maintaining function, so that the suction stability is excessively easily affected by the fluctuations of air pressure. After the placement system for the door of the wafer pod of the present application places the door at the designated position, the docking plate is placed nearly horizontally, and can impart a supporting force to the door, so that dependence on the vacuum suction is decreased, and a modular design for an opening and taking-and-placing mechanism for the door of the wafer pod on the loadport can be achieved, which reduces the integration level of the mechanical structure of the loadport, thereby facilitating the production, assembly, transportation and maintenance of the loadport.

Figure 1:
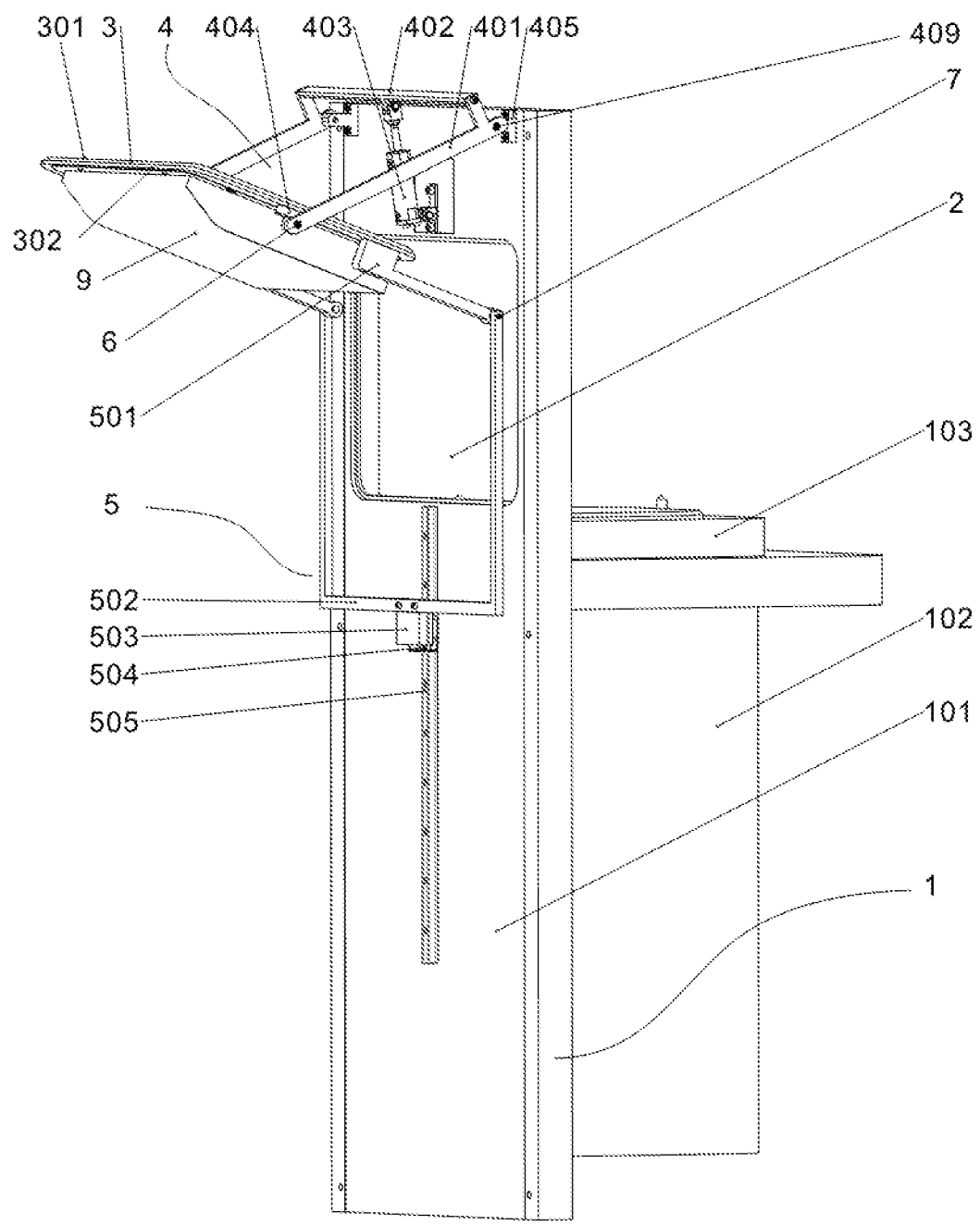
FIG. 1 is a stereostructure diagram of a placement system for a door of a wafer pod.
Figure 2:
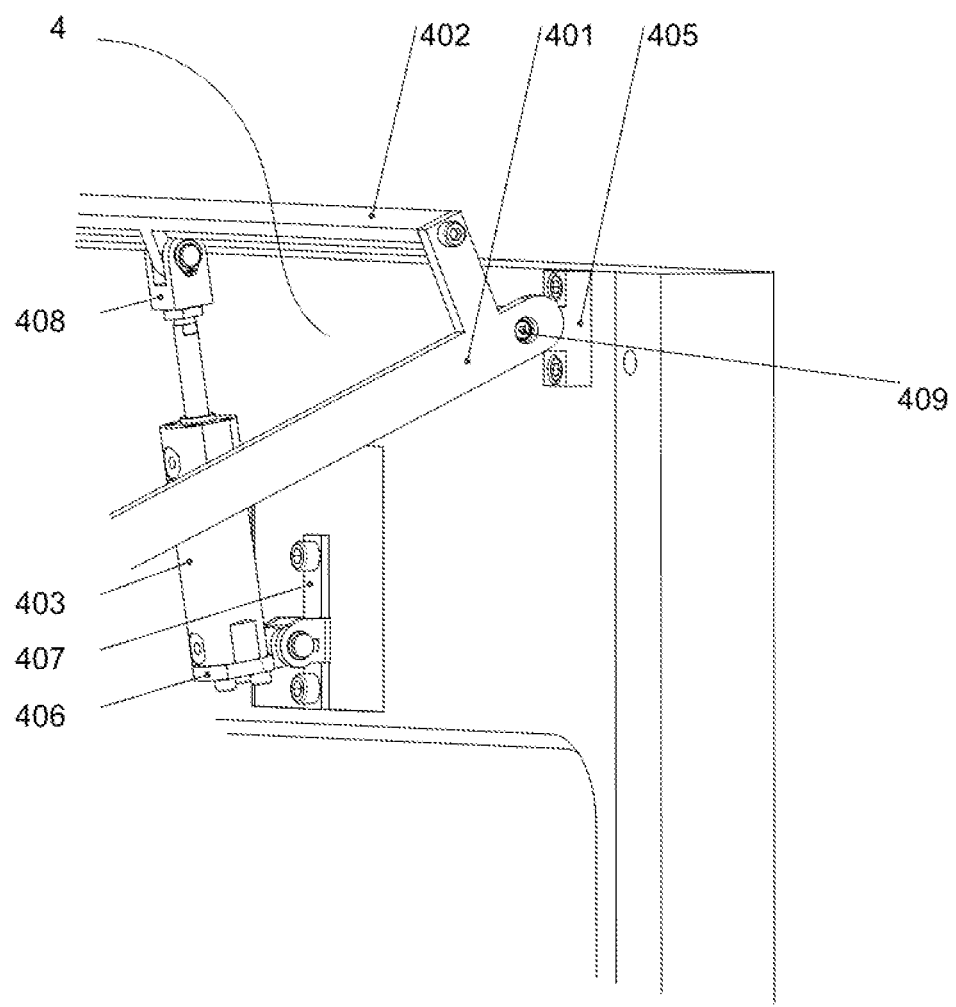
FIG. 2 is a partial schematic diagram of a swing component.

In the drawings:
1. loadport, 2 docking interface, 3. docking plate, 4. swing component, 5. follower component, 6. first rotating shaft, 7. second rotating shaft, 8. door of wafer pod, 9. back cover, 10. wafer pod,
101. base plate, 102. tank, 103. loading table,
301. front side surface of docking plate, 302 back side surface of docking plate,
401. swing rod, 402 cross rod, 403. actuator, 404. first fixing seat, 405. second fixing seat, 406. cylinder tail connecting plate, 407. support, 408. double-knuckle joint, 409. third rotating shaft,
501. connecting rod, 502 movable rod, 503. connecting plate, 504. slider, 505. slide rail.

DETAILED DESCRIPTION OF THE EMBODIMENTS

Preferred embodiments of the present application will be illustrated in detail below in combination with the drawings, so that the advantages and features of the present application can be more easily understood by those skilled in the art, and the protection scope of the present application can be more clearly defined.

Referring to FIGS. 1-11, a placement system for a door of a wafer pod in the embodiment includes a loadport 1. The loadport 1 includes a base plate 101, a tank 102, and a loading table 103; a docking interface 2 is formed in the base plate 101, and is matched with a door 8 of a wafer pod in size; a placement mechanism is arranged on one side surface, facing away from the loading table 103, of the base plate 101, and includes a swing component 4, a follower component 5, and a docking plate 3; the swing component 4 is arranged above the docking interface 2; the follower component 5 is arranged below the docking interface 2; the swing component 4 and the follower component 5 are respectively connected to the docking plate 3, and the swing component 4 can drive the docking plate 3 to place the docking plate 3 obliquely above the docking interface 2; and the follower component 5 can constrain a rotational freedom of the docking plate 3 and enables a front side surface 301 of the docking plate placed in place to face upwards.

The swing component 4 includes swing rods 401, a cross rod 402 and an actuator 403. There are two swing rods 401 which are symmetrically arranged on left and right sides of the docking plate 3. One end of each of the two swing rods 401 is hinged to each of two first fixing seats 404 fixed on the docking plate 3 by a first rotating shaft 6 respectively, and the other end of each of the two swing rods 401 is hinged to each of two second fixing seats 405 fixed on the base plate by a third rotating shaft 409 respectively. Bosses are arranged on the swing rods 401. Two ends of the cross rod 402 are fixedly connected to the bosses of the two swing rods 401 respectively. The actuator 403 is hinged between the cross rod 402 and the base plate 101. The purpose is that the docking plate 3 is located above the docking interface 2 after being opened, and upon actuation by the actuator 403; the swing rods 401 swing about a third rotating shaft 409, and the docking plate 3 is driven to be located above the docking interface 2.

The actuator 403 is a linear motion cylinder. A tail end of a cylinder body of the linear motion cylinder is fixedly connected to a cylinder tail connecting plate 406 fixed on the base plate 101. The cylinder tail connecting plate 406 is hinged to a support 407 fixed on the base plate 101. A piston rod of the linear motion cylinder is fixedly connected to a double-knuckle joint 408. A boss is arranged in the middle of the cross rod 402, and the double-knuckle joint 408 is hinged to the boss of the cross rod 402.

The follower component 5 includes connecting rods 501, a movable rod 502, a slider 504 and a slide rail 505. There are two connecting rods 501 which are arranged in parallel, and are symmetrically arranged on the left and right sides of the docking plate 3. One end of each of the two connecting rods 501 is fixed on a back side surface 302 of the docking plate, and the other end of each of the two connecting rods 501 is hinged to the movable rod 502. Meanwhile, the movable rod 502 is fixedly connected to the slider 504 by the connecting plates 503, and the slide rail 505 is sleeved with the slider 504. The slide rail 505 is vertically fixed on the base plate 101. In the process that the actuator 403 drives the docking plate 3 to move above the docking interface 2, the follower component 5 may constrain the rotation of the docking plate 3 so that the docking plate 3 rotates counterclockwise relative to the loadport 1 (referring to FIG. 1), thereby turning the docking plate 3 stepwise from a vertical state to a state where the front side surface faces upwards.

The movable rod 502 is in a "U" shape; the movable rod 502 is matched with the docking interface 2 in shape and size; and the movable rod 502 and the slider 504 synchronously perform linear translational movement in a plane parallel to the base plate 101 along a direction of the slider 505. Such an arrangement allows, on the one hand, control on the movement path of the docking plate 3 to enable the docking plate 3 to be placed obliquely above the docking interface, and, on the other hand, does not interfere with an operation that a manipulator in an EFEM or a sorter takes wafers from and places wafers in the wafer pod by the docking interface.

Figure 3:
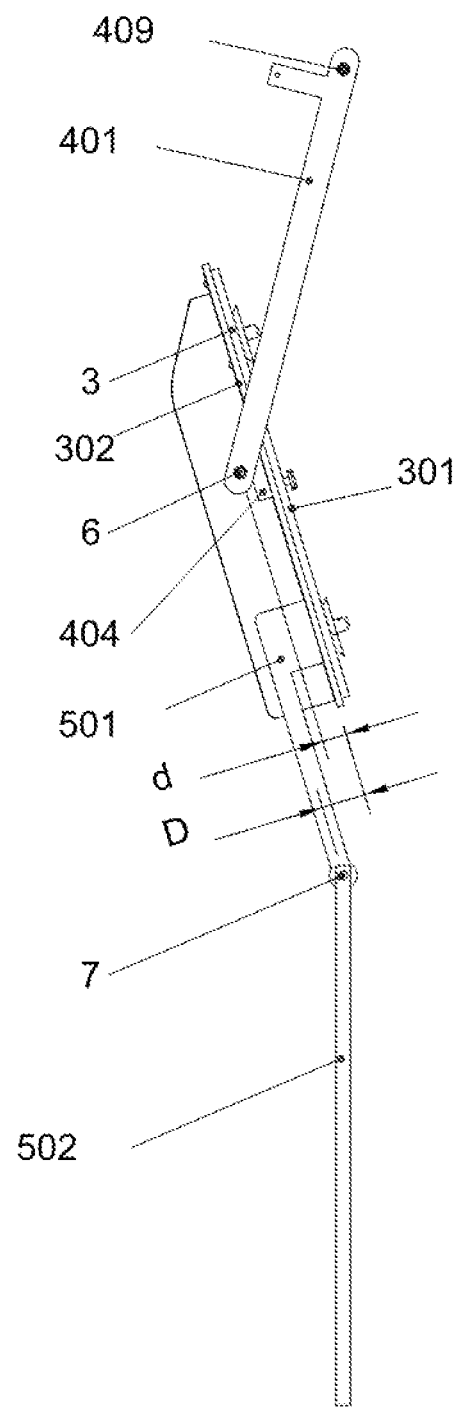
FIG. 3 is a schematic diagram of a position of a swing component and a follower component.
Figure 4:
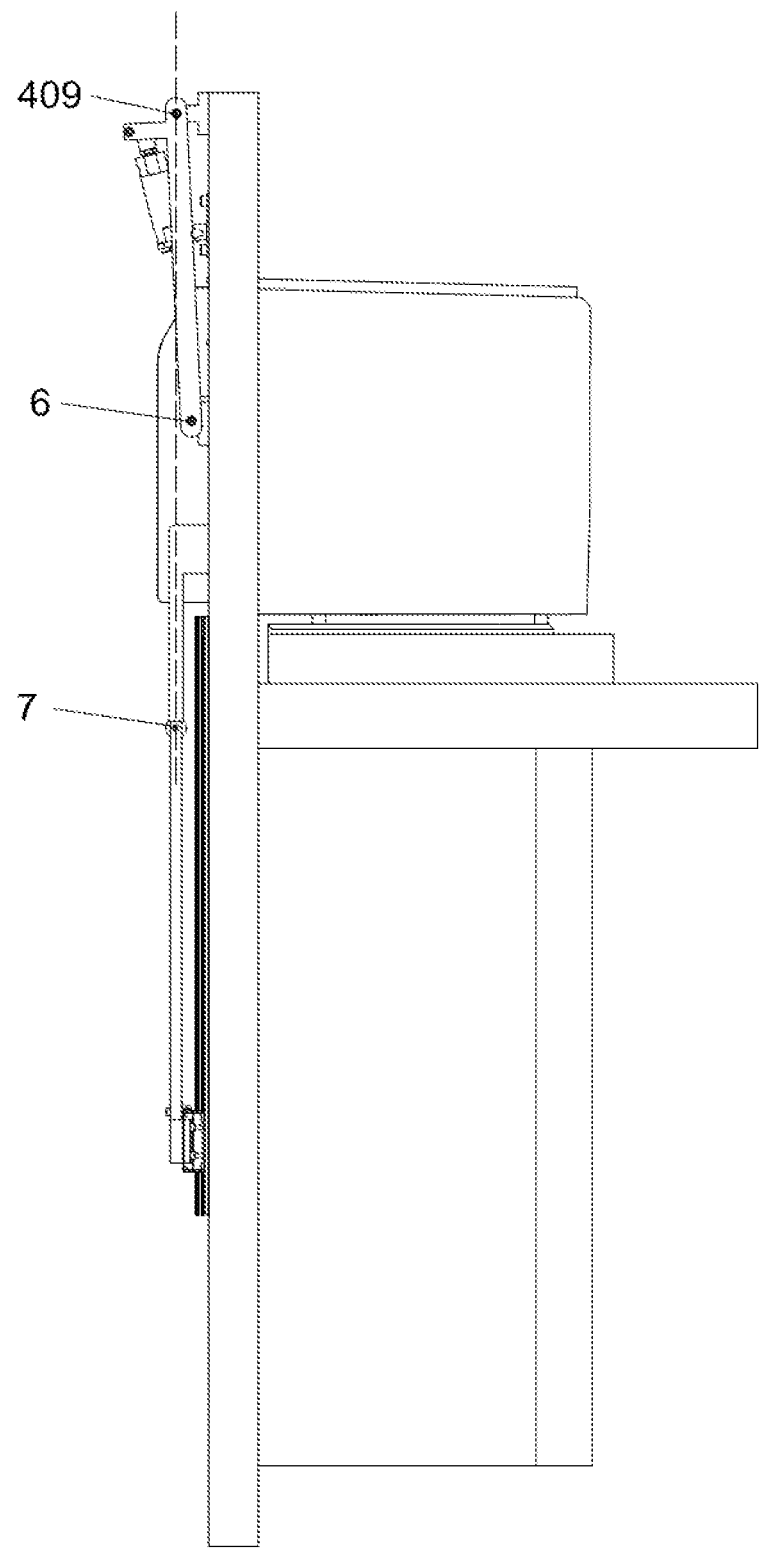
FIG. 4 is a side view of a closed state.
Figure 5:
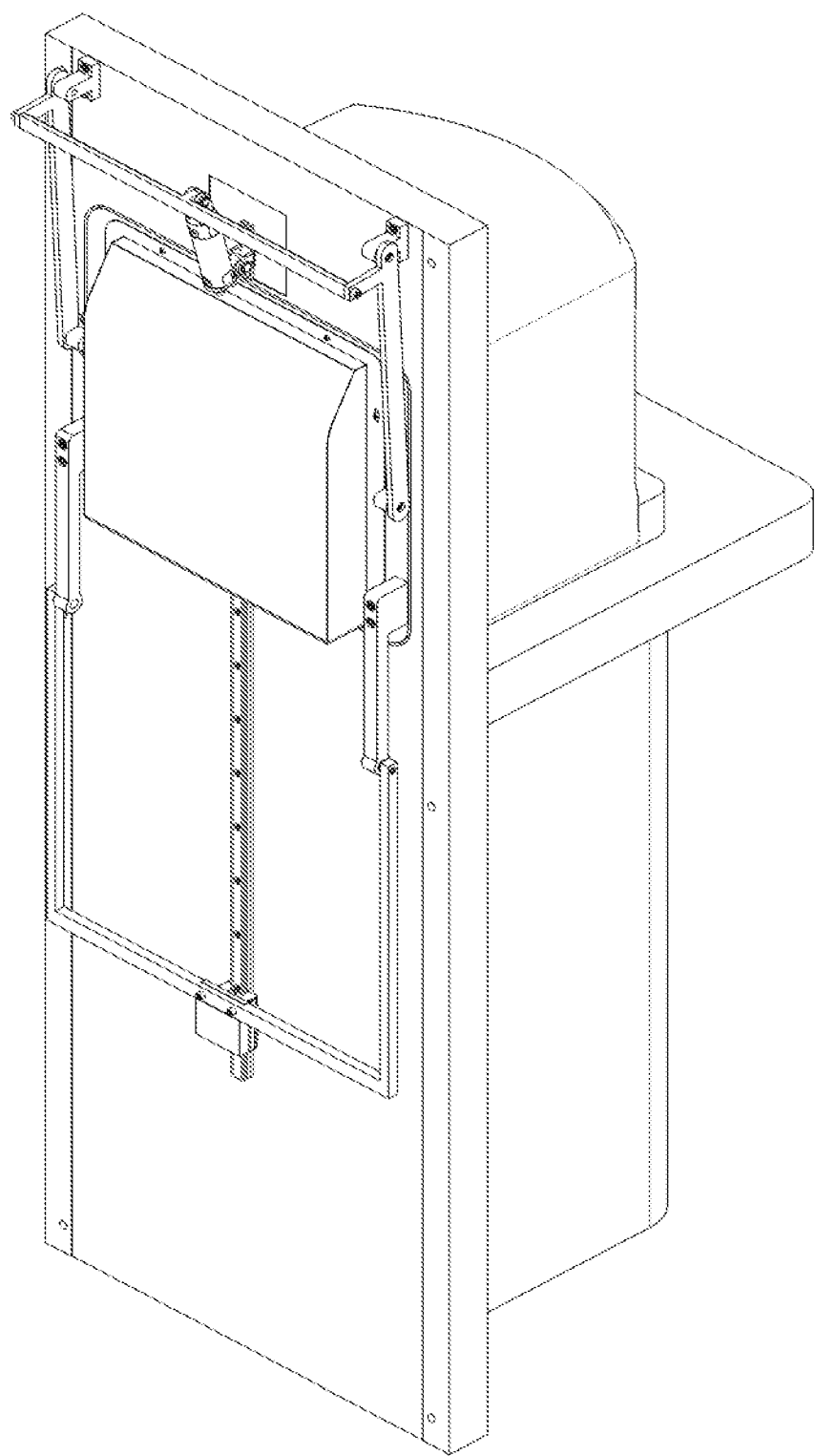
FIG. 5 is a stereoscopic diagram of the closed state.
Figure 6:
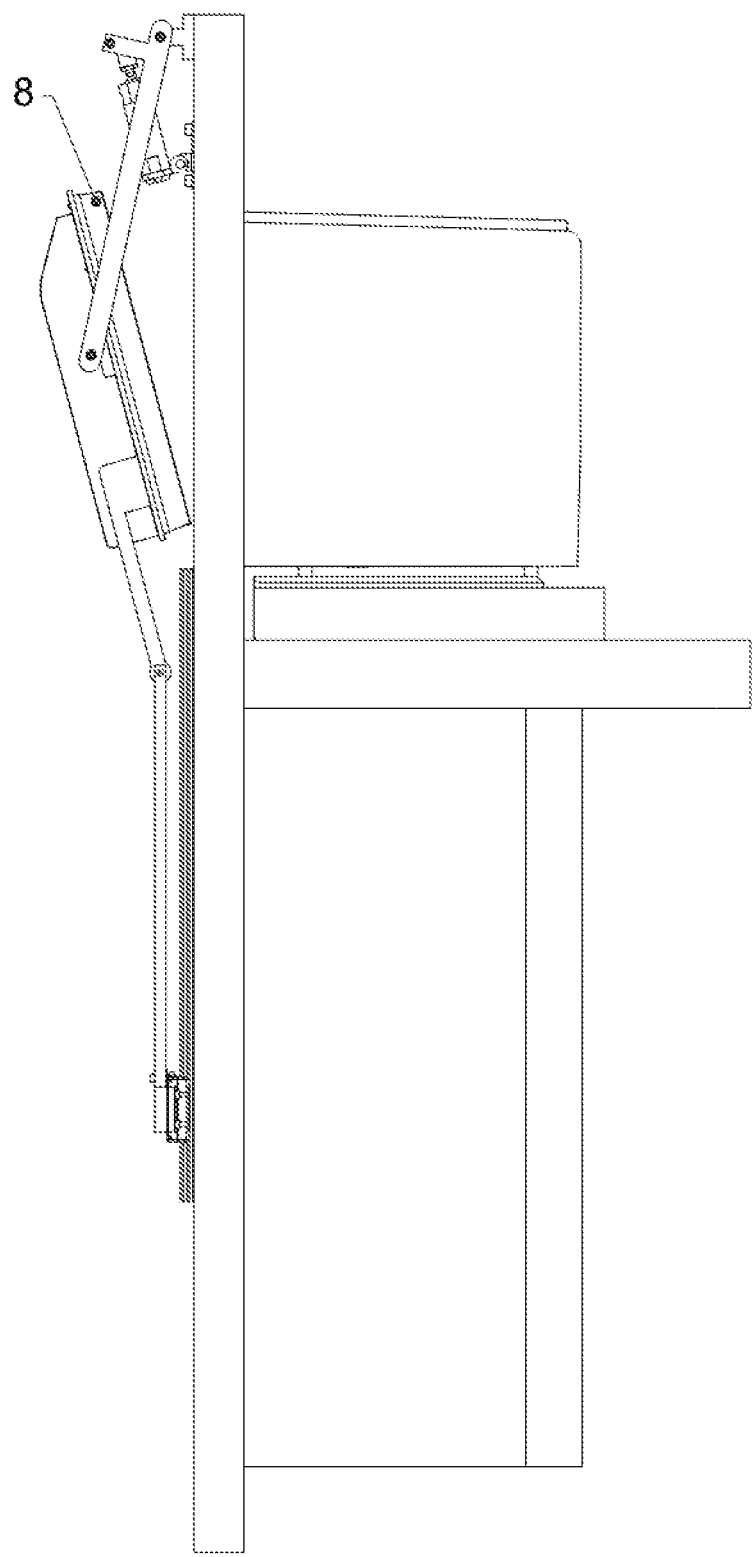
FIG. 6 is a side view of an opening process.
Figure 7:
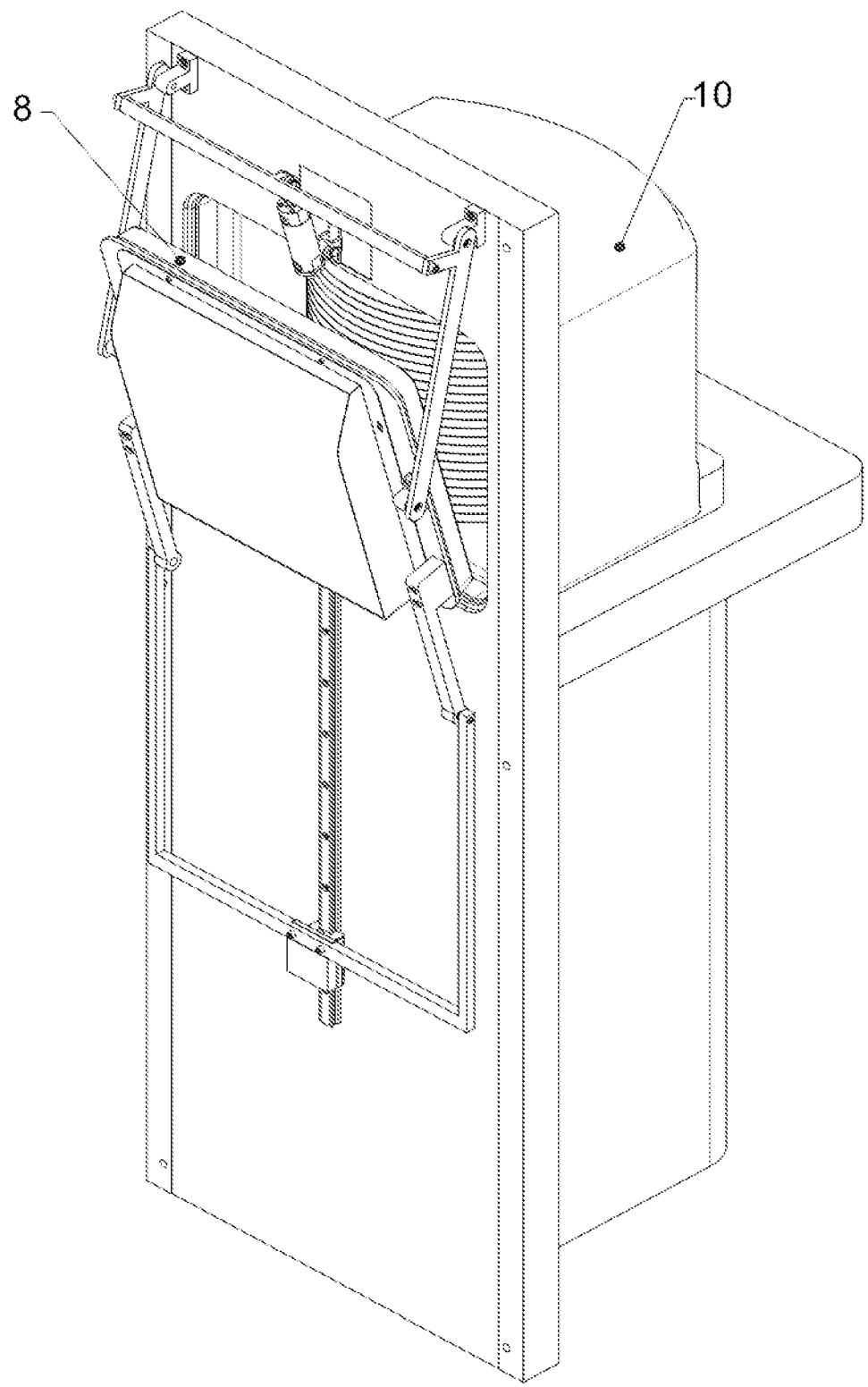
FIG. 7 is a stereoscopic diagram of the opening process.
Figure 8:
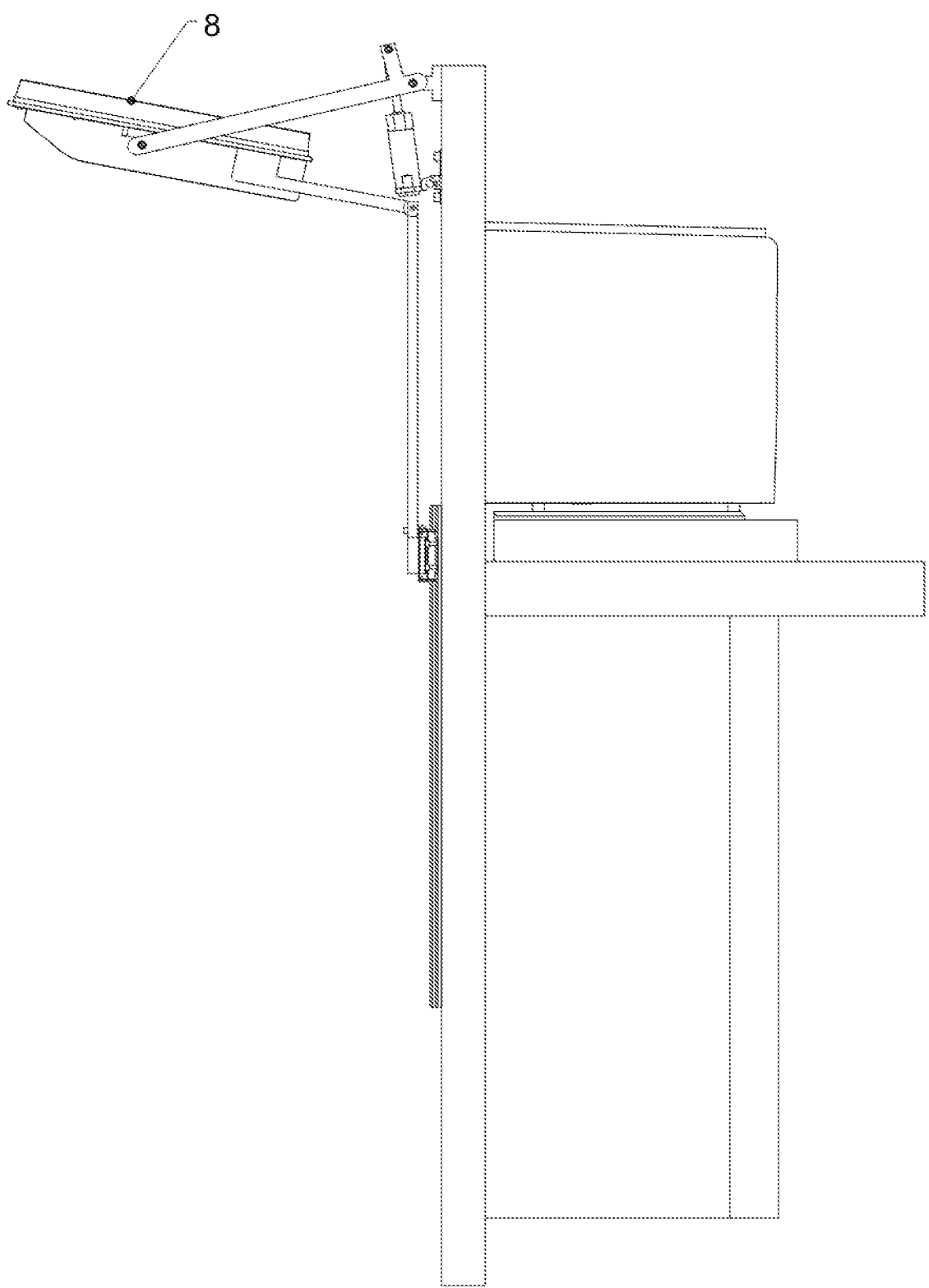
FIG. 8 is a side view of a completely open state.
Figure 9:
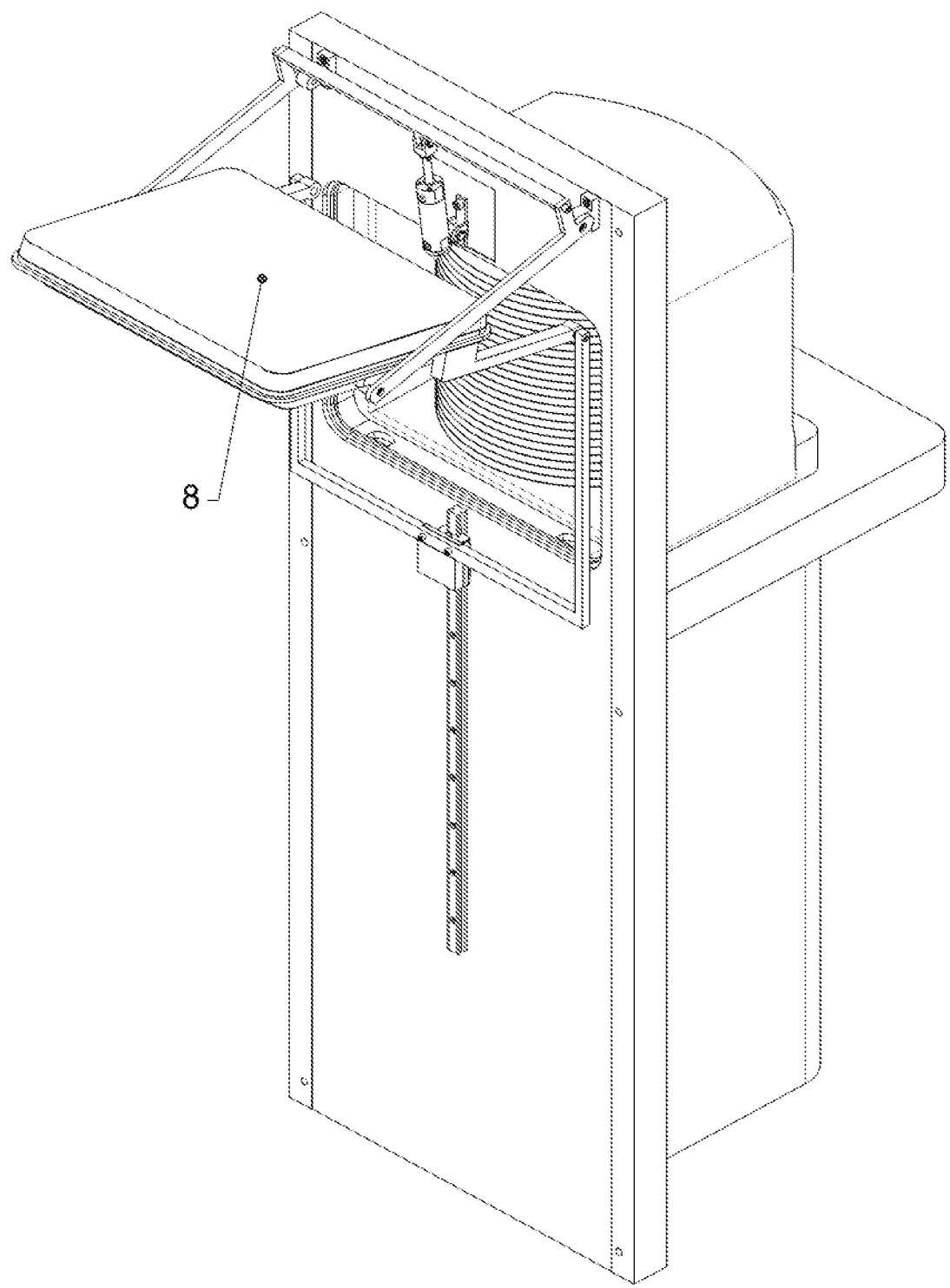
FIG. 9 is a stereoscopic diagram of the completely open state.
Figure 10:
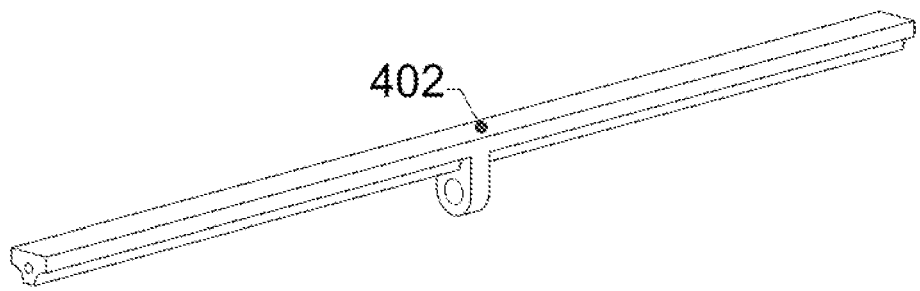
FIG. 10 is a schematic diagram of a cross rod.
Figure 11:
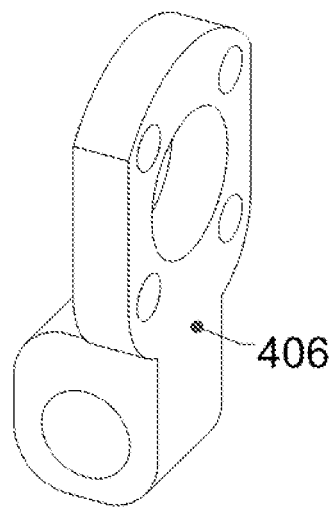
FIG. 11 is a schematic diagram of a cylinder tail connecting plate.

Referring to FIGS. 3-4, in a state where the door of the wafer pod is closed, the docking plate 3 is vertically arranged and is parallel to the base plate 101, and meanwhile, an axis of the third rotating shaft 409 and an axis of the second rotating shaft 7 are on the same vertical plane parallel to the base plate 101 (see dotted line as shown in FIG. 4). The swing rods 401 of the swing component 4 and the first fixing seats 404 are hinged by the first rotating shaft 6, and the first fixing seats 404 are arranged on the back side surface of the docking plate 3. The connecting rods 501 and the movable rod 502 of the follower component 5 are hinged by the second rotating shaft 7. A distance (d) from an axis of the first rotating shaft 6 to the back side surface 302 of the docking plate is less than a distance (D) from the axis of the second rotating shaft 7 to the back side surface 302 of the docking plate. Referring to FIG. 3, the swing rods 401 are part of the swing component 4, the swing rods 401 present a certain degree of reverse inclination with respect to the docking plate 3 at an initial position. This initial reverse inclination reduces the degree of relative inclination of the docking plate 3 in the process that the door 8 is taken out from the wafer pod 10, which avoids that the door 8 contacts inner walls of the wafer pod 10 when being taken out from the wafer pod 10, thereby avoiding friction or thrust between the door 8 and the inner walls of the wafer pod 10 when the door 8 is taken out from the wafer pod 10.

Due to actuation by the placement system, the docking plate 3 can close or open the docking interface 2. During closing, the door 8 of the wafer pod on the other side of the docking interface 2 is adsorbed by a suction cup on the front side surface 301 of the docking plate, and the door 8 is placed at a designated position by actuation of the placement system (the structure and principle for door opening by adsorption are well known in the art, which will be not described in detail). A back cover 9 is further arranged on the back side surface 302 of the docking plate, which seals vacuum lines in order to avoid interference with the lines during movement and to keep the surroundings of the lines clean, since the suction cup for adsorbing the door 8 is arranged on the front side surface 301 of the docking plate, and the vacuum lines providing suction for the suction cup are arranged on the back side surface 302 of the docking plate.

The placement system for the door of the wafer pod makes full use of the space at the tops of the loadport 1, making the structural layout of the loadport 1, the EFEM and the sorter more reasonable. For a conventional loadport, when the door 8 of the wafer pod is taken and placed, the door 8 is always placed vertically, and the door 8 is attached to the docking plate 3 by vacuum suction completely; however, vacuum adsorption does not have the air-off maintaining function. After the placement system for the door 8 of the wafer pod of the present application places the door 8 at the designated position, the docking plate 3 is placed nearly horizontally, and can impart a supporting force to the door 8, so that dependence on the vacuum suction is decreased, and a modular design for an opening and taking-and-placing mechanism for the door 8 of the wafer pod on the loadport can be achieved, which reduces the integration level of the mechanical structure of the loadport, thereby facilitating the production, assembly, transportation and maintenance of the loadport.

Referring in particular to FIGS. 4-9, which are schematic diagrams of closed state-open process-complete open. The basic working principle is as follows. At the initial position, the docking plate 3 is placed centrally with respect to the docking plate 2, and the docking interface 2 is in a closed state. When the loadport 1 starts working, a control system placed in the tank 102 receives information and transmits instructions to control the movement of all actuators on the loadport 1. The wafer pod 10 is placed on the loading table 103, and the loading table 103 then pushes the wafer pod to the docking interface 2. Subsequently, the suction cup mounted on the docking plate 3 sucks the door 8 of the wafer pod. Under the action of suction of the suction cup, the door 8 and the docking plate 3 are attached together. An unlocking loader mounted on the docking plate 3 opens the door 8 of the wafer pod, and the door 8 of the wafer pod is unlocked from the wafer pod 10. The placement system starts working, the piston rod of the actuator 403 extends to push the cross rod 402 to move, thereby driving the swing rods 401 to swing clockwise (from the perspective of the figure) about the first fixing seats 404. The swing rods 401 drive the docking plate 3 to move, and the docking plate 3 further drives the movable rod 502 together with the slider 504 to move vertically upwards along the slide rail 505. The docking plate 3 rotates counterclockwise around a rotating axis of the movable rod 502 while moving upwards together with the movable rod 502. The docking plate 3 swings synchronously with the door 8 of the wafer pod, and the door 8 of the wafer pod swings out from the wafer pod 10. The actuator 403 swings around the support 407 under the counteractive of the cross rod 402. The piston rod of the actuator 403 continues to extend and the movable rod 502 moves upwards, the door 8 of the wafer pod swings stepwise to be obliquely above the docking interface 2, and the wafer pod 10 is completely open. At this point, the door 8 is nearly horizontally placed, the support force is provided by means of the docking plate, thereby decreasing the dependence on the vacuum suction. The docking plate 3 provides the supporting force by means of the actuator 403. Under the action of compressed air, the actuator 403 can, by means of a three-position five-way valve, keep the piston rod to be in an extension state for a long time, thereby avoiding the influence of fluctuations in the ambient air pressure.

The above embodiments are only for illustrating the technical concept and features of the present application, and are intended to make those skilled in the art understand and implement the disclosure of the present application, and are not intended to limit the protective scope of the present application. Equivalent changes or modifications made in accordance with the spirit of the present application are intended to be included in the protective scope of the present application.

What is claimed is:

1. A placement system for a door of a wafer pod, comprising a loadport, wherein the loadport comprises a base plate, a tank, and a loading table; a docking interface is formed in the base plate, and is matched with the door of the wafer pod in size; a placement mechanism is arranged on one side surface, facing away from the loading table, of the base plate, and comprises a swing component, a follower component, and a docking plate; the swing component is arranged above the docking interface, and the follower component is arranged below the docking interface; the swing component and the follower component are respectively connected to the docking plate, and the swing component can drive the docking plate to place the docking plate obliquely above the docking interface; the follower component can constrain a rotational freedom of the docking plate and enables a front side surface of the docking plate placed in place to face upwards; wherein the swing component comprises a swing rod and a cross rod; one end of the swing rod is hinged to a first fixing seat fixed on a back side surface of the docking plate by a first rotating shaft, and the other end of the swing rod is hinged to a second fixing seat fixed on the base plate;

the follower component comprises a connecting rod and a movable rod; the connecting rod is hinged to the movable rod by a second rotating shaft; one end of the connecting rod is fixed on the back side surface of the docking plate, and the other end of the connecting rod is hinged to the movable rod; the movable rod can move up and down along the base plate; and a distance from an axis of the first rotating shaft to the back side surface of the docking plate is less than a distance from an axis of the second rotating shaft to the back side surface of the docking plate.

2. The placement system for the door of the wafer pod according to claim 1, wherein the swing component further comprises an actuator, there are two swing rods which are symmetrically arranged on left and right sides of the docking plate; one end of each of the two swing rods is hinged to each of two first fixing seats fixed on the docking plate respectively, and the other end of each of the two swing rods is hinged to each of two second fixing seats fixed on the base plate respectively; bosses are arranged on the swing rods; two ends of the cross rod are fixedly connected to the bosses of the two swing rods respectively; and the actuator is hinged between the cross rod and the base plate.

3. The placement system for the door of the wafer pod according to claim 2, wherein the actuator is a linear motion cylinder; a tail end of a cylinder body of the linear motion cylinder is fixedly connected to a cylinder tail connecting plate fixed on the base plate; the cylinder tail connecting plate is hinged to a support fixed on the base plate; a piston rod of the linear motion cylinder is fixedly connected to a double-knuckle joint; and a boss is arranged in the middle of the cross rod, and the double-knuckle joint is hinged to the boss of the cross rod.

4. The placement system for the door of the wafer pod according to claim 1, wherein the follower component further comprises a slider and a slide rail; there are two connecting rods which are arranged in parallel, and are symmetrically arranged on the left and right sides of the docking plate; one end of each of the two connecting rods is fixed on a back side surface of the docking plate, and the other end of each of the two connecting rods is hinged to the movable rod; meanwhile, the movable rod is fixedly connected to the slider by the connecting plates, and the slide rail is sleeved with the slider, and the slide rail is vertically fixed on the base plate.

5. The placement system for the door of the wafer pod according to claim 4, wherein the movable rod is in a "U" shape; the movable rod is matched with the docking interface in shape and size; and the movable rod and the slider synchronously perform linear translational movement in a plane parallel to the base plate along a direction of the slider.

6. The placement system for the door of the wafer pod according to claim 2, wherein the swing rods of the swing component are hinged to the second fixing seats by a third rotating shaft.

7. The placement system for the door of the wafer pod according to claim 6, wherein in a state where the door of the wafer pod is closed, the docking plate is vertically arranged, and is parallel to the base plate, and meanwhile, an axis of the third rotating shaft and the axis of the second rotating shaft form a vertical plane that is parallel to the base plate.

* * * * *